(12) United States Patent
Myo (10) Patent No.: US 11,467,222 B2
(45) Date of Patent: Oct. 11, 2022

(54) ELECTRICAL APPARATUS AND METHOD FOR DETERMINING EARTH STATE OF ELECTRICAL APPARATUS

(71) Applicants: MAANSHAN CITY MINGZHU ELECTRONIC TECHNOLOGY COMPANY LIMITED, Maanshan (CN); OH-LASER CO., LTD, Saitama (JP)

(72) Inventor: Itsuho Myo, Saitama (JP)

(73) Assignee: MAANSHAN CITY MINGZHU ELECTRONIC TECHNOLOGY COMPANY LIMITED, Maanshan (CN)

( * ) Notice: Subject to any disclaimer, the term of this patent is extended or adjusted under 35 U.S.C. 154(b) by 496 days.

(21) Appl. No.: 16/494,780

(22) PCT Filed: Mar. 30, 2018

(86) PCT No.: PCT/JP2018/013954
§ 371 (c)(1),
(2) Date: Sep. 17, 2019

(87) PCT Pub. No.: WO2019/123673
PCT Pub. Date: Jun. 27, 2019

(65) Prior Publication Data
US 2020/0096549 A1 Mar. 26, 2020

(30) Foreign Application Priority Data
Dec. 19, 2017 (JP) .............................. JP2017-242733

(51) Int. Cl.
*G01R 31/56* (2020.01)
*G01R 31/50* (2020.01)
*H01H 83/02* (2006.01)

(52) U.S. Cl.
CPC .............. *G01R 31/56* (2020.01); *G01R 31/50* (2020.01); *H01H 83/02* (2013.01)

(58) Field of Classification Search
CPC ........ G01R 31/58; G01R 31/66; G01R 31/67; G01R 31/55; G01R 31/50; G01R 31/52; H01H 83/02
See application file for complete search history.

(56) References Cited

U.S. PATENT DOCUMENTS 10,088,500 B2 * 10/2018 Wiesemann ............. G01R 1/04
2004/0174173 A1 * 9/2004 Elms ...................... G01R 31/67
324/509

(Continued)

FOREIGN PATENT DOCUMENTS

CN 106569084 A * 4/2017
GB 2531017 A * 4/2016 ........... F24H 9/2014

*Primary Examiner* — Patrick Assouad
*Assistant Examiner* — Demetrius R Pretlow
(74) *Attorney, Agent, or Firm* — Wen IP LLC; Zhihua Han (57) ABSTRACT

A method capable of effectively detecting an earth state and an electrical apparatus using the same are provided. The electrical apparatus includes a first detection unit for detecting whether there is power between a power supply line L and an earth line G and outputting a first detection signal, a second detection unit for detecting whether there is power between a neutral line N and the earth line G and outputting a second detection signal, and an earth state determining unit for determining an earth state according to the first detection signal and the second detection signal and determining whether a power supply is connected in a normal phase or a reversed phase.

13 Claims, 7 Drawing Sheets

(56) References Cited

U.S. PATENT DOCUMENTS

| | | | | |
|---|---|---|---|---|
| 2005/0275409 | A1* | 12/2005 | Mason | G01R 31/69 |
| | | | | 324/508 |
| 2009/0201027 | A1* | 8/2009 | Sexton | G01R 31/58 |
| | | | | 324/527 |
| 2012/0268136 | A1* | 10/2012 | Lee | G01R 31/66 |
| | | | | 324/508 |
| 2014/0375328 | A1* | 12/2014 | Lenzie | G01R 31/67 |
| | | | | 324/508 |
| 2016/0097802 | A1* | 4/2016 | Suica | G01R 31/52 |
| | | | | 324/508 |
| 2016/0327599 | A1* | 11/2016 | Wiesemann | G01R 19/155 |
| 2016/0327601 | A1* | 11/2016 | Brockman | G01R 31/67 |
| 2018/0231598 | A1* | 8/2018 | Hsu | G01R 31/58 |
| 2018/0294642 | A1* | 10/2018 | Madsen | H02H 3/162 |
| 2019/0372340 | A1* | 12/2019 | Lee | H02H 9/041 |
| 2020/0150189 | A1* | 5/2020 | Lee | G01R 31/50 |
| 2021/0103007 | A1* | 4/2021 | Gordon | G01R 31/58 |
| 2021/0143635 | A1* | 5/2021 | Schuck | G01R 31/58 |

* cited by examiner

ELECTRICAL APPARATUS AND METHOD FOR DETERMINING EARTH STATE OF ELECTRICAL APPARATUS

CROSS REFERENCE TO RELATED APPLICATION

This application is a national stage application of International application number PCT/JP2018/013954, filed Mar. 30, 2018, titled "ELECTRICAL APPARATUS AND GROUNDING STATE DETECTION METHOD FOR ELECTRICAL DEVICE," which claims the priority benefit of Japanese Patent Application No. 2017-242733, filed on Dec. 19, 2017, which is hereby incorporated by reference in its entirety.

BACKGROUND

Technical Field

The present invention discloses an electrical apparatus and a method for detecting an earth state of an electrical apparatus, and in particular, to an electrical apparatus capable of effectively detecting whether an electrical apparatus is earthed and whether a commercial power supply is connected in a normal phase or a reversed phase, and a method for detecting an earth state of an electrical apparatus.

Related Art

Traditional Commercial Laser Processing Machine

Commercial laser processing machines have been widely known. The commercial laser processing machines use RF excitation laser generators. The RF excitation laser generators have the advantages of long service life and high stability. In addition, DC power supplies used when the RF excitation laser generators emit laser light do not need to support high voltage, so the RF excitation laser generators are favored by many top laser manufacturers.

On the other hand, the price of one RF excitation laser generator is mostly in the range of several hundred thousand yen to several million yen, and the price of a laser processing machine using the RF excitation laser generator is generally not less than 1 million yen. Therefore, goods (laser processing machine) in the price zone exert a high purchasing pressure on private or small and medium-sized enterprises.

Laser Processing Machine Developed by the Applicant for the Patent

The applicant for the patent has been engaged in the sales of desktop small laser processing machines since its establishment in 2011. A laser generator used in the laser processing machine manufactured and sold by the applicant for the patent is not the above-mentioned RF excitation laser generator, but a glass tube high-voltage excitation laser generator previously used. The glass tube high-voltage excitation generator is lower in cost than the high-frequency RF laser generator, but it should be noted that high voltage used in laser emission reaches about 200,000 volts or more. Once a leakage occurs, the high voltage will flow into a human body, so it will be very dangerous.

Therefore, the laser processing machine manufactured and sold by the applicant for the patent must be earthed, and the necessity is marked in a large font in the instruction manual to remind a user.

Prior Art Literature

Disclosed in Patent Document 1 is a method for determining whether to be earthed by detecting a voltage between an earth line and a power supply line. In addition, also disclosed in Patent Document 2 is substantially the same technical content as Patent Document 1.

Also disclosed in Patent Document 3 is a method for testing a voltage between a voltage line and an earth system. Moreover, also disclosed in Patent Document 4 is substantially the same technical content as Patent Document 3.

PRIOR ART LITERATURE

Patent Document

[Patent Document 1] Patent Publication No. 2009-245791
[Patent Document 2] Patent Publication No. 2009-245792
[Patent Document 3] Patent Publication No. 2010-205569
[Patent Document 4] Patent Publication No. 2010-205570

SUMMARY

1. Problem to be Solved

In the past, a high-voltage electrical apparatus used an Earth Leakage Circuit Breaker (ELB) to prevent a leakage, but the power supply of the high-voltage electrical apparatus sold by the applicant for the patent was changed from AC to DC, and it was difficult for the ELB to detect a leakage.

The present invention provides, in view of the above circumstances, a method capable of effectively detecting earth of a high-voltage electrical apparatus (e.g., an electrical apparatus using a high-voltage excitation laser generator) and an electrical apparatus using the same.

2. Technical Solution

In order to achieve the above object, the inventors of the patent have concentrated on the following principles.

In order to solve the leakage risk of an electrical apparatus, the inventor of the patent concentrated on an earth detection method and finally successfully invented an earth detection circuit. In particular, the earth detection circuit may simultaneously detect the reversed-phase connection of a power supply line.

Specifically, the present invention adopts the following method.

(1) An electrical apparatus (e.g., a laser processing device 10 described below) involved in the present invention is an electrical apparatus using AC between a power supply line L (e.g., a terminal L described below) of a commercial power supply and a neutral line N (e.g., a terminal N described below) of a commercial power supply. The electrical apparatus includes: a first detection unit (e.g., a first detection unit 14 described below) for detecting whether there is power between the power supply line L of the commercial power supply and an earth line G of the commercial power supply, and outputting a first detection signal (e.g., an Earth_L signal); a second detection unit (e.g., a second detection unit 16 described below) for detecting whether there is power between the neutral line N of the commercial power supply and the earth line G of the commercial power supply, and outputting a second detection signal (e.g., an Earth_N signal); and an earth state determining unit (e.g., an earth state determining unit 18 described below) for determining an earth state according to the first detection signal and the second detection signal. The earth state determining unit determines that: when the first detection signal indicates that there is power between the power supply line L and the earth line G and the second detection signal indicates that there is no power between the neutral line N and the earth line G, the commercial power supply is connected to the electrical apparatus in a normal phase, and the earth line G is earthed; when the first detection signal indicates that there is no power between the power supply line L and the earth line G and the second detection signal indicates that there is power between the neutral line N and the earth line G, the commercial power supply is connected to the electrical apparatus in a reversed phase, and the earth line G is earthed; and when the first detection signal indicates that there is power between the power supply line L and the earth line G and the second detection signal indicates that there is power between the neutral line N and the earth line G, the earth line G is not earthed.

(2) In the electrical apparatus described in (1), when the first detection signal indicates that there is no power between the power supply line L and the earth line G and the second detection signal indicates that there is no power between the neutral line N and the earth line G, the earth state determining unit determines, in place of the determination in (1), that the earth line G is not earthed.

When the first detection signal indicates that there is no power between the power supply line L and the earth line G and the second detection signal indicates that there is no power between the neutral line N and the earth line G, it should be determined that the earth line G is not earthed.

(3) In the electrical apparatus described in (1), the first detection unit and the second detection unit should be included.

The first detection unit includes a first rectifier circuit provided between the power supply line L and the earth line G, and a first signal output circuit for detecting whether the first rectifier circuit has a rectified voltage and outputting the first detection signal.

The second detection unit includes a second rectifier circuit provided between the neutral line N and the earth line G, and a second signal output circuit for detecting whether the second rectifier circuit has a rectified voltage and outputting the second detection signal.

(4) In the electrical apparatus described in (3), the first rectifier circuit and the second rectifier circuit should be included.

The first rectifier circuit is a first full-wave rectifier circuit (e.g., a first bridge rectifier circuit 30 described below) for full-wave rectification. The first signal output circuit includes a first optical coupler (e.g., a first optical coupler 40 described below) for receiving a first output signal of the first full-wave rectifier circuit and outputting the first detection signal, that is, an insulation signal of the first output signal.

The second rectifier circuit is a second full-wave rectifier circuit (e.g., a second bridge rectifier circuit 36 described below) for full-wave rectification. The second signal output circuit includes a second optical coupler (e.g., a second optical coupler 46 described below) for receiving a second output signal of the second full-wave rectifier circuit and outputting the second detection signal, that is, an insulation signal of the second output signal.

(5) In the electrical apparatus described in (3), the first rectifier circuit and the second rectifier circuit should be included.

The first rectifier circuit is a first half-wave rectifier circuit (e.g., a first diode 60 described below) for half-wave rectification. The first signal output circuit includes a first optical coupler for receiving a first output signal of the first half-wave rectifier circuit and outputting the first detection signal, that is, an insulation signal of the first output signal.

The second rectifier circuit is a second half-wave rectifier circuit (e.g., a second diode 64 described below) for half-wave rectification. The second signal output circuit includes a second optical coupler for receiving a second output signal of the second half-wave rectifier circuit and outputting the second detection signal, that is, an insulation signal of the second output signal.

(6) In the electrical apparatus described in any one of (1) to (5), the earth state determining unit should interrupt an output of the electrical apparatus based on a determination result of the earth state determining unit.

(7) In the electrical apparatus described in any one of (1) to (5), an alarm unit (e.g., an alarm unit 20 described below) for giving an alarm to a user of the electrical apparatus according to a determination result of the earth state determining unit should be included.

(8) In the electrical apparatus described in any one of (1) to (5), a display unit (e.g., a display unit 22 described below) for prompting, according to a determination result of the earth state determining unit, the determination result to a user of the electrical apparatus should be included.

(9) An electrical apparatus (e.g., a laser processing device 10 described below) involved in the present invention is an electrical apparatus utilizing AC between a power supply line L (e.g., a terminal L described below) of a commercial power supply and a neutral line N (e.g., a terminal N described below) of a commercial power supply. The electrical apparatus includes: a first detection unit (e.g., a first detection unit 14 described below) for detecting whether there is power between the power supply line L of the commercial power supply and an earth line G of the commercial power supply, and outputting a first detection signal (e.g., an Earth_L signal); a second detection unit (e.g., a second detection unit 16 described below) for detecting whether there is power between the neutral line N of the commercial power supply and the earth line G of the commercial power supply, and outputting a second detection signal (e.g., an Earth_N signal); and an earth state determining unit (e.g., an earth state determining unit 18 described below) for outputting the first detection signal and the second detection signal to the outside.

(10) In the electrical apparatus described in (9), the earth state determining unit should generate, when the first detection signal is a periodic signal, a first notification signal having a value of "1", generate, when the first detection signal is a non-periodic signal, a first notification signal having a value of "0", generate, when the second detection signal is a periodic signal, a second notification signal having a value of "1", generate, when the second detection signal is a non-periodic signal, a second notification signal having a value of "0", and output the first notification signal and the second notification signal to the outside.

(11) An earth state determining method used by an electrical apparatus (e.g., a laser processing device 10 described below) involved in the present invention is an earth state determining method for detecting an earth state of an electrical apparatus. The electrical apparatus uses AC power generated between a power supply line L (e.g., a terminal L described below) of a commercial power supply and a neutral line N (e.g., a terminal N described below) of a commercial power supply. The electrical apparatus includes: a first detection unit (e.g., a first detection unit 14 described below) for detecting whether there is power between the power supply line L of the commercial power supply and an earth line G of the commercial power supply, and outputting a first detection signal (e.g., an Earth_L signal); a second detection unit (e.g., a second detection unit 16 described below) for detecting whether there is power between the neutral line N of the commercial power supply and the earth line G of the commercial power supply, and outputting a second detection signal (e.g., an Earth_N signal); and an earth state determining unit (e.g., an earth state determining unit 18 described below) for determining an earth state according to the first detection signal and the second detection signal.

The earth state determining method includes:

a first detection step of detecting, by the first detection unit, whether there is power between the power supply line L of the commercial power supply and the earth line G of the commercial power supply and outputting a first detection signal;

a second detection step of detecting, by the second detection unit, whether there is power between the neutral line N of the commercial power supply and the earth line G of the commercial power supply and outputting a second detection signal; and an earth state determining step of determining, by the earth state determining unit, an earth state according to the first detection signal and the second detection signal.

The earth state determining step includes any one of the following steps:

first step: when the first detection signal indicates that there is power between the power supply line L and the earth line G and the second detection signal indicates that there is no power between the neutral line N and the earth line G, determining that the commercial power supply is connected to the electrical apparatus in a normal phase, and the earth line G is earthed;

second step: when the first detection signal indicates that there is no power between the power supply line L and the earth line G and the second detection signal indicates that there is power between the neutral line N and the earth line G, determining that the commercial power supply is connected to the electrical apparatus in a reversed phase, and the earth line G is earthed; and third step: when the first detection signal indicates that there is power between the power supply line L and the earth line G and the second detection signal indicates that there is power between the neutral line N and the earth line G, the earth line G is not earthed.

(12) In the earth state determining method described in (11), in place of step 3, there should be step 4: when the first detection signal indicates that there is no power between the power supply line L and the earth line G and the second detection signal indicates that there is no power between the neutral line N and the earth line G, determining that the earth line G is not earthed.

3. Beneficial Effect

According to the present invention, whether or not earthing is achieved (whether an earth line G terminal is connected to the earth) can be detected regardless of whether a power supply is connected in a normal phase or in a reversed phase. In addition, when earthing, it can also be determined whether the power supply is connected in a reversed phase or a normal phase.

In which:

8: Commercial power supply; 8a: Plug;
10: Laser processing device; 12: Laser processing machine;
14, 114: First detection unit; 16, 116: Second detection unit;
18: Earth state determining unit; 20: Alarm unit; 22: Display unit; 24: Personal Computer (PC);
30: First bridge rectifier circuit; 32a, 32b, 32c: Resistor;
36: Second bridge rectifier circuit; 37a, 37b, 37c: Resistor;
40: First optical coupler; 42: Resistor; 44: First signal output circuit;
46: Second optical coupler; 48: Resistor; 50: Second signal output circuit;
60: First diode; 62a, 62b, 62c: Resistor;
64, 164: Second diode; 66a, 66b, 66c: Resistor;
70: Third optical coupler; 76, 176: Fourth optical coupler;
80, 180: Diode.

DETAILED DESCRIPTION

The embodiments of the present invention are described below with reference to schematic drawings.

A. EMBODIMENT 1

1. Laser Processing Device 10

Figure 1:
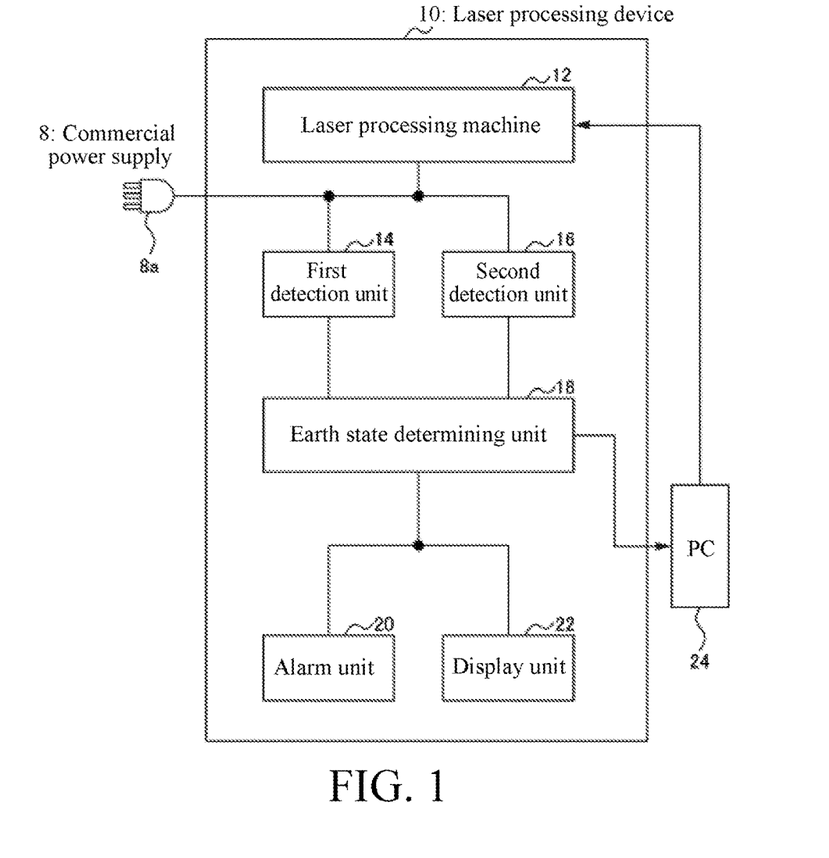
FIG. 1 is a configuration diagram of a laser processing device 10 according to Embodiment 1 of the present invention.

FIG. 1 is a configuration diagram of a laser processing device 10 having an earth detection function in Embodiment 1. The laser processing device 10 is a typical example of an electrical apparatus within the scope of the application.

As shown in FIG. 1, the laser processing device 10 includes a laser processing machine 12 for laser processing, and the laser processing machine 12 may be used to process a specified object. The laser processing machine 12 may adopt various processing machines 12 that have been developed. A semiconductor laser or a carbonic acid gas laser may be used. In recent years, the price of a carbon dioxide laser processing machine of about 40 W is often very favorable. Such a household laser processing machine 12 may also be used.

The laser processing device 10 is a device that operates using a commercial power supply 8 with a plug 8a for obtaining a commercial power supply. The commercial power supply 8 supplies power to the laser processing machine 12 through the plug 8a.

This embodiment is characterized in that the laser processing device 10 includes a first detection unit 14, a second detection unit 16 and an earth state determining unit 18. With this configuration, an earth state of the commercial power supply 8 that supplies power to the laser processing device 10 can be determined. In addition, the laser processing device 10 is as described below. The laser processing device 10 may further include an alarm unit 20 and a display unit 22.

The first detection unit 14 and the second detection unit 16 obtain AC through the commercial power supply 8, and respectively output a first detection signal and a second detection signal which display the earth state of the commercial power supply 8 for supplying power to the laser processing device 10.

The earth state determining unit 18 determines an earth state of the laser processing device 10 according to the first detection signal and the second detection signal. The details are as follows.

2. Determination of Earth State

(a) Power Supply

First, the laser processing device 10 of the present embodiment obtains an alternating current AC 100V through an L (power supply line) terminal and an N (neutral line) terminal of an AC power supply (commercial power supply). Japanese AC 100V is taken as an example here, and other countries can use other voltages (e.g., AC 200V).

Moreover, the L (power supply line) terminal is a terminal connecting a power supply line. The power supply line is a typical example of a power supply line L within the scope of the application. In addition, the N (neutral line) terminal is a terminal connecting a neutral line. The neutral line is a typical example of a neutral line N within the scope of the application.

(b) Electrical Apparatus

The AC 100V supplies power to the laser processing machine 12 through the L and N terminals. Here, the laser processing machine 12 is described as an example. But actually, any electrical apparatus that utilizes AC to supply power through the L terminal (connecting a power supply line) and the N terminal (connecting a neutral line) can be used regardless of the type of electrical apparatuses or the type of circuits.

(c) First Detection Unit 14 and Second Detection Unit 16

Figure 2A:
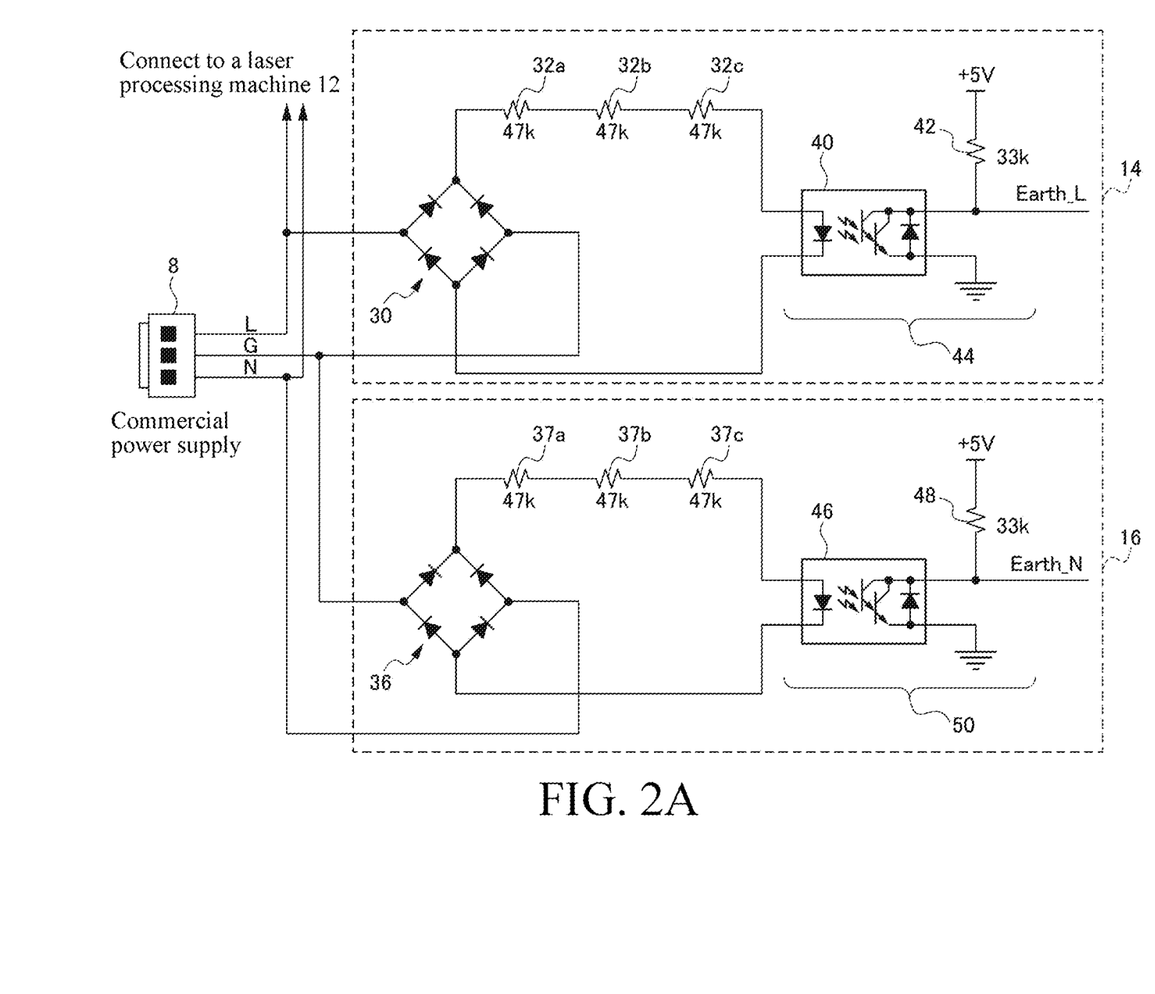
FIG. 2A is a circuit diagram of a first detection unit 14 and a second detection unit 16 according to Embodiment 1 of the present invention.

The circuit diagram of the first detection unit 14 and the second detection unit 16 is shown in FIG. 2A.

(c-1) First Detection Unit 14

The first detection unit 14 basically consists of a first bridge rectifier circuit 30 and a first signal output circuit 44.

The first bridge rectifier circuit is a typical example of a first full-wave rectifier circuit within the scope of the application, and the first signal output circuit is a typical example of a first signal output circuit within the scope of the application.

The first detection unit 14 is as shown in FIG. 2A, and the first bridge rectifier circuit 30 is connected between the L terminal and a G terminal.

Moreover, the G terminal refers to a terminal portion that is connected to the earth through an earth wire. The earth line here is a typical example of an earth line G within the scope of the application.

After the L terminal is connected to the commercial power supply (energized), a DC circuit is formed between the L terminal and the G terminal. DC output by the circuit is limited by three resistors (32a, 32b, 32c, respectively) of 48KΩ in series, and output to the first signal output circuit 44 for power supply as described below.

The first signal output circuit 44 "detects" a DC voltage acquired by the first bridge rectifier circuit 30 to generate an Earth_L signal.

A first optical coupler 40 is required for the detection step. The DC voltage is applied to an input end of the first optical coupler 40. When a specified current flows, an output circuit of the first optical coupler 40 is turned on, and a digital signal Earth_L is output to an external device. However, the Earth_L signal is pulled up to 5V through a resistor 42.

The Earth_L signal is a typical example of a first detection signal within the scope of the application.

(c-2) Second Detection Unit 16

The second detection unit 16 basically consists of a second bridge rectifier circuit 36 and a second signal output circuit 50.

The second bridge rectifier circuit 36 is a typical example of a second full-wave rectifier circuit within the scope of the application. The second signal output circuit 50 is a typical example of a second signal output circuit within the scope of the application.

The second detection unit 16 is as shown in FIG. 2A, and the second bridge rectifier circuit 36 is connected between the N terminal and the G terminal.

After the N terminal is connected to the commercial power supply (energized), a DC circuit is formed between the N terminal and the G terminal. DC output by the circuit is limited by three resistors (37a, 37b, 37c, respectively) of 48KΩ in series, and output to the second signal output circuit 44 as described below.

The second signal output circuit 50 "detects" a DC voltage acquired by the second bridge rectifier circuit 36 to generate an Earth_L signal.

A second optical coupler 46 is required for the detection step. The DC voltage is applied to an input end of the second optical coupler 46. When a specified current flows, an output circuit of the second optical coupler 46 is turned on, and a digital signal Earth_N is output to an external device. However, the Earth_N signal is pulled up to 5V through the resistor 42.

The Earth_N signal is a typical example of a second detection signal within the scope of the application.

(d) Circuit Action 1 (Where a G Terminal is Connected to the Earth)

In a circuit under the present embodiment, when the G terminal is connected to the earth and the power supply is connected in a normal phase, a voltage difference of 100V (effective value) is generated between the L terminal and the G terminal (in Japan, for example), where a weak current flows. Similarly, when the power supply is connected in a reversed phase, a voltage difference of 100V (effective value) is generated between the N terminal and the G terminal, where a weak current flows.

That is, when the power supply is connected in a normal phase, since the current flows into an input circuit of the first optical coupler 40, the output circuit of the first optical coupler 40 is turned on. Therefore, an output value of the Earth_L signal (digital signal) at an output end of the first optical coupler 40 is "L".

In addition, when the power supply is connected in a reversed phase, since the current flows into an input circuit of the second optical coupler 46, the output circuit of the second optical coupler 46 is turned on. Therefore, an output value of the Earth_N signal (digital signal) at an output end of the second optical coupler 46 is "L".

(e) Circuit Action 2 (Where a G Terminal is Not Connected to the Earth)

When the G terminal (earth line) is not connected to the earth, the voltage difference between the L terminal and the G terminal (and the voltage difference between the N terminal and the G terminal) depends on an AC sine wave.

(f) Earth State Determining Unit 18

When a connection state of the G terminal (earth line) is detected, a detection result (a detection signal such as an Earth_N signal or an Earth_L signal) is transmitted to the earth state determining unit 18.

For example, the earth state determining unit 18 is a CPU that executes various actions of the earth state determining unit 18 by executing a specified program. The CPU is preferably a CPU of a computer or a CPU of a microchip, and may be other CPU.

The earth state determining unit 18 (CPU) converts the received detection signal, that is, the Earth_N signal or the Earth_L signal, into a signal used by a specified digital interface, and outputs it to the outside. As shown in FIG. 2A, Earth_N or Earth_L is a digital signal that obtains a value "H" or "L".

First, the earth state determining unit 18 continuously observes the Earth_L signal and generates a first notification signal. When a level of the Earth_L signal is maintained in an "H" state (the state in which the duration exceeds a specified time), "0" is displayed, and when the level of the Earth_L signal is periodically repeated (the H and L states are alternately repeated), "1" is displayed.

Then, the earth state determining unit 18 continuously observes the Earth_N signal and generates a second notification signal. When a level of the Earth_N signal is maintained in an "H" state (the state in which the duration exceeds a specified time), "0" is displayed, and when the level of the Earth_N signal is periodically repeated (the H and L states are alternately repeated), "1" is displayed.

The earth state determining unit 18 embeds the first notification signal and the second notification signal into the architecture of an interface such as a USB interface, and transmits an obtained USB signal to the external device through the USB interface.

Therefore, in the case of normal earthing and normal-phase connection, (first notification signal, second notification signal) is displayed as (1, 0). In the case of normal earthing and reversed-phase connection, (first notification signal, second notification signal) is displayed as (0, 1). In addition, in the case of not normal earthing, (first notification signal, second notification signal) is displayed as (1, 1).

For example, the external device is a PC24 (referring to FIG. 1), where the PC24 may receive the first notification signal or the second notification signal through an interface such as a USB interface.

Therefore, the external computer (PC24) may perform the desired processing by determining a power connection state of the laser processing device 10.

In the configuration shown in FIG. 1, the external device PC24 may determine the connection state of the power supply according to the first notification signal or the second notification signal.

Figure 3A:
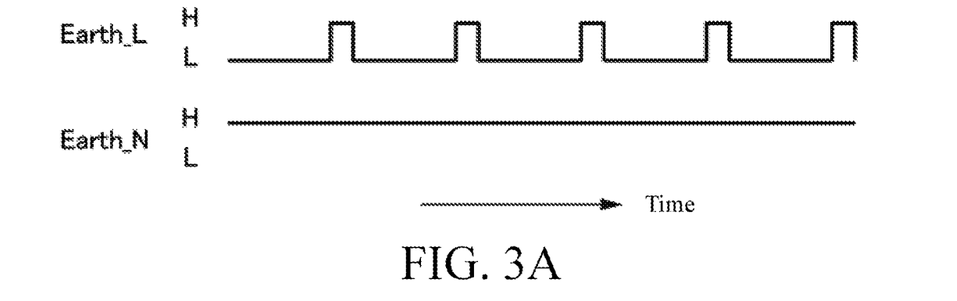
FIG. 3A is a waveform diagram of an Earth_L signal and an Earth_N signal during a normal-phase connection according to Embodiment 1 of the present invention.

(f-1) Case Where a G Terminal is Connected to the Earth and a Power Supply is Connected in a Normal Phase, That is, a Neutral Line of a Commercial Power Supply (Power System) is Connected to an N Terminal and a Power Supply Line is Connected to an L Terminal In this case, the wave curves of the Earth_L signal and the Earth_N signal are as shown in FIG. 3A. The Earth_L signal and the Earth_N signal are the digital signals, having the value "H" or "L", as described above. In addition, the horizontal axis of the schematic diagram represents time. As shown in FIG. 3A, the Earth_L signal is a periodic signal in which the "L" and "H" states are alternately repeated. In addition, the Earth_N signal should be the same as an earth level, so an output voltage of the second bridge rectifier circuit 36 is 0, and the second optical coupler 46 does not operate (referring to FIG. 2A). Therefore, the Earth_N signal is continuously pulled up to be maintained in an "H" (5V) state (referring to FIG. 3A).

In this way, the Earth_L signal is a periodic change signal. When the Earth_N signal does not change, as described above, the earth state determining unit 18 generates (first notification signal, the second notification signal) as (1, 0). Therefore, the external device PC24 may be as described above, and it may be determined that a power supply system is connected in a normal phase and the G terminal has been connected to the earth.

The present embodiment is characterized in that: according to the detection signal (or the first notification signal and the second notification signal generated by the detection signal), it can be determined whether earthing is achieved (whether the G terminal is connected to the earth), and it can also be determined whether the power supply is connected in a normal phase or a reversed phase.

Moreover, the earth state determining unit 18 may input, by a CPU and the like, the Earth_L signal or the Earth_N signal through a specified I/O interface, and perform periodic sampling monitoring on the signal values to determine whether it is "periodic change" and generate the above first notification signal and second notification signal.

In addition, the reason why the Earth_L signal periodically changes when the L terminal (FIG. 2A) is correctly connected to a positive electrode of the power supply (when the power supply is connected in a normal phase) will be described with reference to FIG. 4. In this case, a specified AC voltage is generated between the L terminal and the G terminal, so that the waveform of an output voltage of the first bridge rectifier circuit 30 is a waveform after full-wave rectification. See the schematic diagram of FIG. 4 for details.

Figure 4:
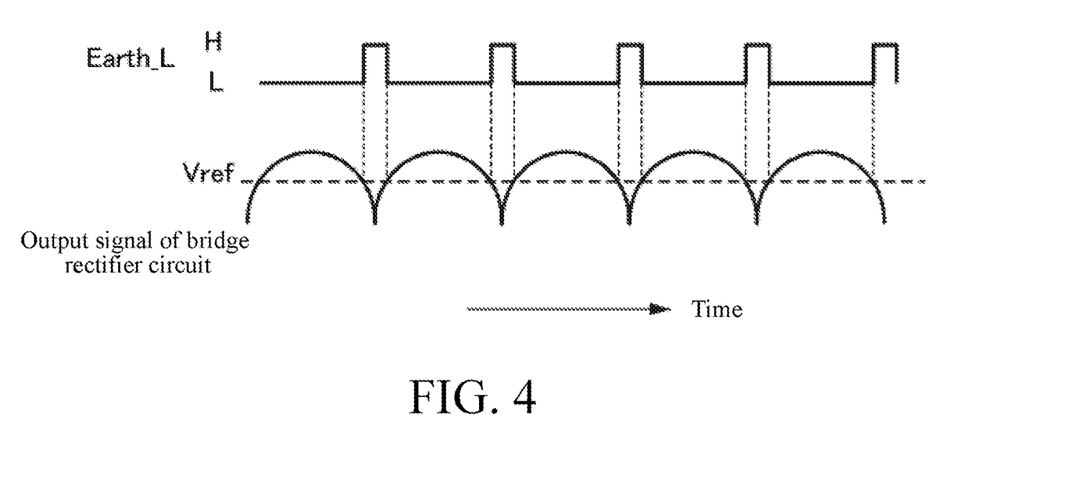
FIG. 4 is a schematic diagram of a detection signal being a periodic signal.

FIG. 4 is a full-wave rectification output waveform of the first bridge rectifier circuit 30. A full-wave rectification signal is applied to the first optical coupler 40 via resistors 32a, 32b, 32c. Therefore, from the input characteristics of the optical coupler, when the voltage exceeds a specified reference voltage Verf, the first optical coupler is turned on, and the Earth_L signal is changed from "H" to "L". When the voltage is lower than the reference voltage Verf, the first optical coupler is turned off, and the Earth_L signal is maintained in an "H" state. Therefore, the Earth_L signal is a periodic signal in which the "H" and "L" states are alternately repeated according to an output voltage value of the first bridge rectifier circuit. See the schematic diagram of FIG. 4 for details. In addition, a voltage value of the reference voltage Verf is substantially dependent on the characteristics of the first optical coupler 40.

FIG. 4 shows an illustration of the Earth_L signal, but a relationship between the Earth_N signal and the output voltage of the second bridge rectifier circuit 36 is also the same.

Figure 3B:
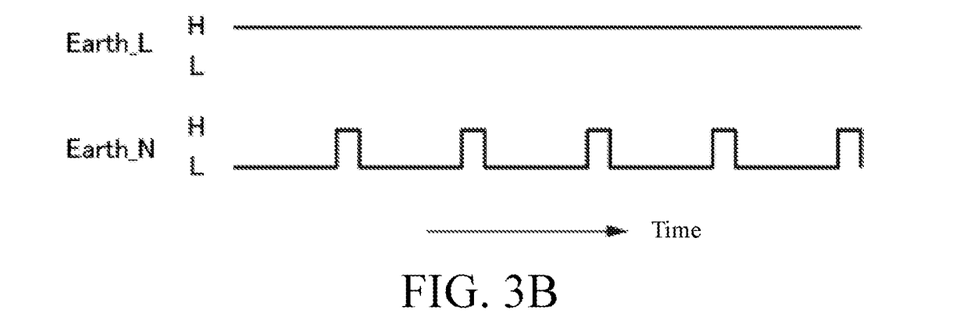
FIG. 3B is a waveform diagram of an Earth_L signal and an Earth_N signal during a reversed-phase connection according to Embodiment 1 of the present invention.

(f-2) Case Where an Earth Terminal G is Connected to the Earth and a Power Supply is Connected in a Reversed Phase, That is, a Neutral Line of a Commercial Power Supply (Power System) is Connected to an L Terminal and a Power Supply Line is Connected to an N Terminal In this case, the wave curves of the Earth_L signal and the Earth_N signal are as shown in FIG. 3B. The Earth_L signal and the Earth_N signal are the digital signals, having the value "H" or "L", as described above. In addition, the horizontal axis of the schematic diagram represents time. As shown in FIG. 3B, the Earth_N signal is a periodic signal in which the "L" and "H" states are alternately repeated. In addition, the Earth_H signal should be the same as an earth level, so an output voltage of the first bridge rectifier circuit 30 is 0, and the first optical coupler 40 is turned off (referring to FIG. 2A). Therefore, the Earth_L signal is boosted to be continuously maintained in an "H" (5V) state (referring to FIG. 3B).

In this way, the Earth_N signal is a periodic change signal. When the Earth_L signal does not change, as described above, the earth state determining unit 18 generates (first notification signal, the second notification signal) as a digital signal (0, 1). Therefore, the external device PC24 may be as described above, and it may be determined that a power supply system is connected in a reversed phase and the G terminal is connected to the earth.

In FIG. 3B, since the power supply is connected in a reversed phase, the case of the Earth_L signal and the Earth_N signal is opposite to the above (f-1). This can be understood by comparing the schematic diagrams of FIG. 3B and FIG. 3A.

Therefore, based on Embodiment 1, according to the detection signal (the Earth_L signal and the Earth_N signal) (or the first notification signal and the second notification signal generated by the detection signal), it can be determined whether earthing is achieved (whether the G terminal is connected to the earth), and it can also be determined whether the power supply is connected in a normal phase or a reversed phase.

Moreover, in the case of (f-2), the reason why the Earth_N signal exhibits a periodic change is exactly the same as that explained in (f-1). In addition, the method in which the earth state determining unit 18 determines whether the detection signal periodically changes or non-periodically changes is the same as the method explained in (f-1).

Figure 3C:
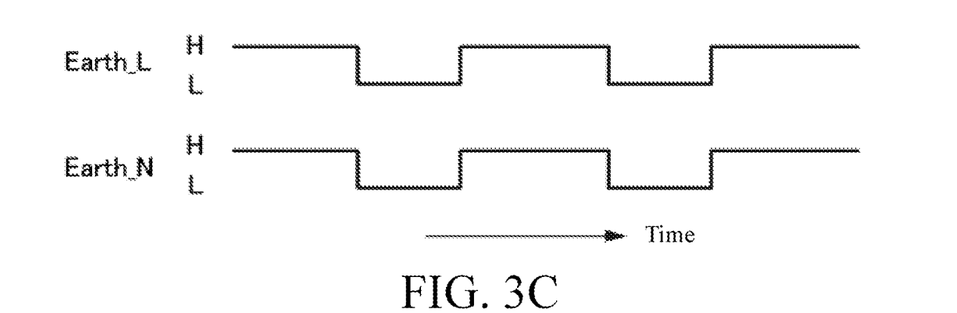
FIG. 3C is a waveform diagram of an Earth_L signal and an Earth_N signal when an earth G terminal is not connected to the earth according to Embodiment 1 of the present invention.

(f-3) Case Where a G Terminal is Not Connected to the Earth and a Power Supply is Connected in a Normal Phase or a Reversed Phase In this case, the wave curves of the Earth_L signal and the Earth_N signal are as shown in FIG. 3C. The Earth_L signal and the Earth_N signal are the digital signals, having the value "H" or "L", as described above. In addition, the horizontal axis of the schematic diagram represents time. As shown in FIG. 3C, the Earth_N signal and the Earth_L signal are periodic signals (signals in which the "H" and "L" states are alternately repeated in a fixed time).

Figure 2B:
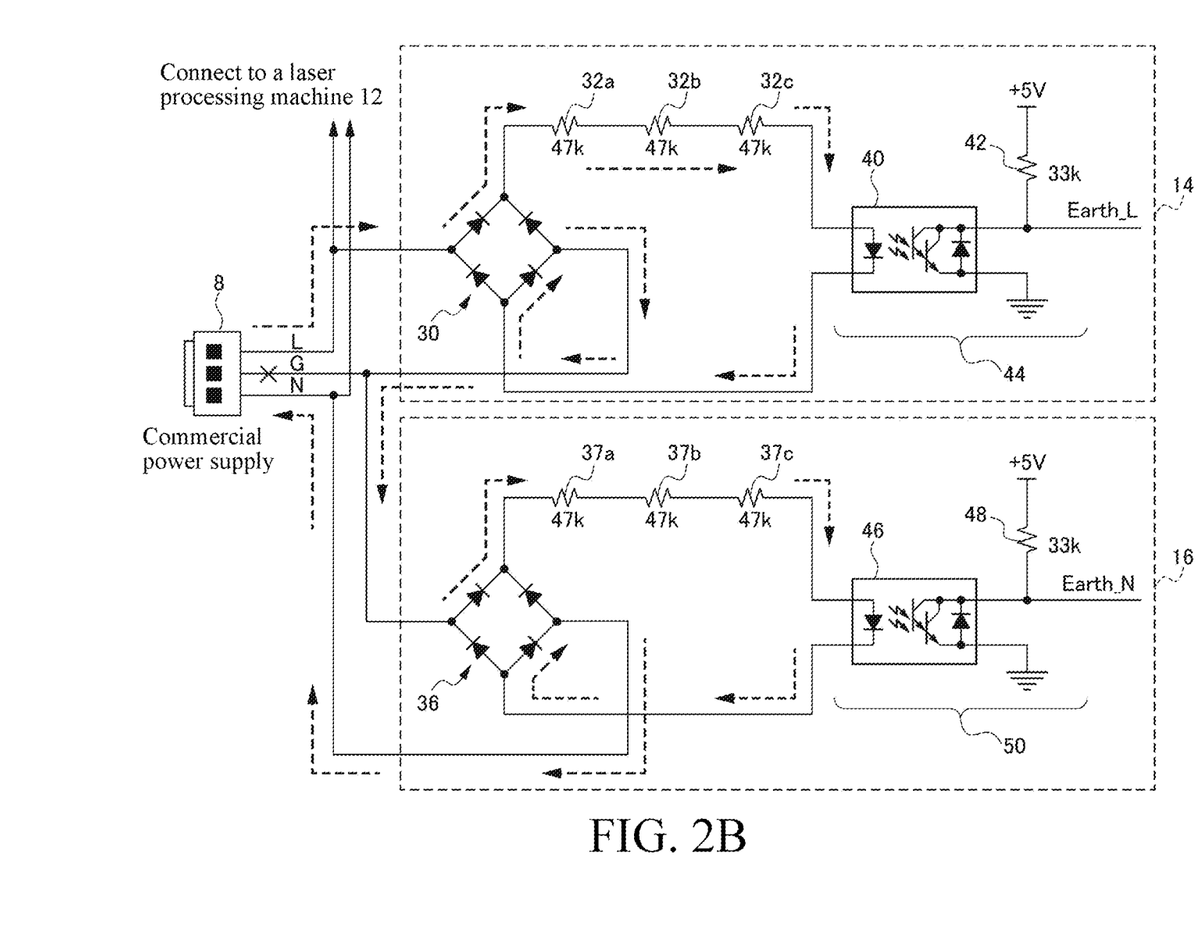
FIG. 2B is a circuit diagram of a current flowing path during non-earthing in FIG. 2A.

(f-3) is a case where the G terminal in FIG. 2A and the like is not connected to the earth. Therefore, when the L terminal is a positive electrode, a current flows from the L terminal through the first bridge rectifier circuit 30 and the second bridge rectifier circuit to the N terminal at a negative electrode. Therefore, the first optical coupler 40 and the second optical coupler 46 become in an on state. The flow of the current is shown in FIG. 2B. In FIG. 2B, a bold dotted arrow indicates the flow direction of the current.

FIG. 2B clearly shows that the current will only flow if the L terminal is the positive electrode. Therefore, the current (FIG. 2B) flows during half a period of AC and does not flow during the other half period. Therefore, both the Earth_L signal and the Earth_N signal are periodic signals in which "H" (5V) and "L" (0V) are alternately repeated (referring to FIG. 3C).

Thus, when both the Earth_L signal and the Earth_N signal are periodically changing signals, as described above, the earth state determining unit 18 may determine that the power system is connected in a normal phase or a reversed phase and the G terminal is not connected to the earth. In addition, since the Earth_L signal and the Earth_N signal of the earth state determining unit 18 are periodically changing signals, the above (first notification signal, second notification signal) is displayed as (1, 1). In addition, when the external device PC24 detects that both the first notification signal and the second notification signal are "1", it may be determined that the G terminal is not earthed.

The present embodiment is characterized in that whether the G terminal is earthed (whether the G terminal is connected to the earth) may be determined according to the detection signal regardless of whether the power supply is connected in a normal phase or a reversed phase. Therefore, the present embodiment can more accurately determine whether the G terminal is earthed.

Of course, as described above, the earth state may be determined as well according to the first notification signal and the second notification signal generated by the first detection signal and the second detection signal. Therefore, the present embodiment can more accurately determine whether the G terminal is earthed.

(g) Advantages in Japan

In particular, the L terminal and the N terminal are not distinguished in Japan mostly. Therefore, it is necessary to be able to detect the connection situation of an earth line even when the L terminal and the N terminal are reversed (reversed connection). In the present embodiment, the connection situation of the earth line can be detected regardless of the reversed-phase connection or the normal-phase connection.

The reason is that, as shown in FIG. 2A, the detection circuit of the L terminal and the detection circuit of the N terminal are identical. Therefore, even if the L terminal and the N terminal are in a reversed-phase connection state with respect to the commercial power supply, the earth state can be determined as described above.

3. Action of PC24

In the above description, the earth state determining unit 18 generates the first notification signal and the second notification signal according to the detection signal Earth_L (first detection signal) and the Earth_N signal (second detection signal), and outputs the first notification signal and the second notification signal to the outside. In particular, the earth state determining unit 18 (e.g., CPU) first converts the notification signals into signals used by a digital interface such as a USB interface, and then transmits the signals to an external device. By means of the method, the external device PC24 may determine the earth state thereof and determine whether the power supply is connected in a normal phase or a reversed phase at one time according to the first notification signal and the second notification signal, and may perform the desired processing. The desired processing may be freely set by a user. For example, as shown in FIG. 1, the external device PC24 may control the laser processing machine 12. Therefore, the laser processing device 10 preferably includes a control input terminal (not shown) for controlling the laser processing machine 12.

The external device PC24 may transmit a control signal to the laser processing machine 12 through the control input terminal.

For example, the PC24 may perform various security protection actions when the G terminal is not connected to the earth, such as stopping the laser processing machine 12, cutting off the output, prohibiting the laser processing machine 12 from starting, and stopping the power supply to the laser processing machine 12. The actions may also be freely set by a user.

4. Other Actions of Earth State Determining Unit 18

An example of controlling the laser processing machine 12 by the external PC24 has been described above. However, an external device equivalent to the PC24 may also be arranged inside the laser processing device 10. Thus, the laser processing device 10 itself may perform the above control on the laser processing machine 12 according to the earth situation.

The method may also utilize the earth state determining unit 18. The earth state determining unit 18 may determine the earth state (and the normal-phase/reversed-phase connection of the power supply) according to the Earth_L signal (first detection signal) and the Earth_N signal (second detection signal) and control the laser processing machine 12 through the determination result.

4-2. Alarm Unit 20 and Display Unit 22

In addition, the earth state determining unit 18 determines the earth state (and the normal-phase/reversed-phase connection of the power supply) according to the Earth_L signal (first detection signal) and the Earth_N signal (second detection signal), and controls the laser processing machine 12 according to the determination result like the above example, or performs various other controls.

For example, when the earth state determining unit 18 detects that the G terminal is not connected to the earth, the alarm unit 20 may be controlled to alert a user and prompt the user to connect the G terminal to the earth. The alarm unit 20 may emit various alarm sounds using a buzzer or a horn or the like. An alarm may be given by sound, or an alarm may also be given by a light source or the like.

In addition, the earth state determining unit 18 may control the display unit 22 to indicate that the power supply is in a reversed-phase connection state when the power supply is connected in a reversed phase. The user can know, according to the prompt, that the power supply is connected in a reversed phase. Similarly, the display unit 22 may also prompt that the G terminal is not connected to the earth. Therefore, the user can know, according to the prompt, that the G terminal is not earthed (the G terminal is not connected to the earth through a connection line). Therefore, the user can be aware that it must be earthed.

Although the alarm unit 20 and the display unit 22 are not indispensable components in Embodiment 1, the presence of these portions is convenient for the user.

In addition, the earth state determining unit 18 generates a first notification signal and a second notification signal according to the Earth_L signal (first detection signal) and the Earth_N signal (second detection signal), and then may determine the earth state (and the normal-phase/reversed-phase connection of the power supply) according to the first notification signal and the second notification signal.

5. Others (1) The laser processing machine 12 In Embodiment 1 may adopt a glass tube high-voltage excitation laser. The inventor of the patent uses a 40 W-class carbon dioxide sealed glass tube high-voltage excitation laser to actually manufacture the laser processing device 10, which has won praises from users.

In addition, although the earth state detecting method has long been widely known, it is easy to confirm the earth state by providing a high-performance earth detection circuit which is smaller than the conventional art in a circuit of such a glass tube high-voltage excitation laser generator, so that the user can use it with confidence. This is an original intention of the inventor of the patent.

(2) Sockets in China, the United States and Europe all have G terminals (earth terminals), so there is little unearthing, but household power sockets with earth terminals have not been widely used in Japan. Therefore, the unearthing situation sometimes occurs when the laser processing device is normally used, and the present embodiment is very effective for this.

(3) Therefore, the technology in the present embodiment is a very effective safety countermeasure especially for Japan. Low cost and high detection accuracy achieved by a simple circuit configuration contribute greatly to the spread of laser processing devices.

B. EMBODIMENT 2

1. Half-Wave Rectification

In Embodiment 1, the first bridge rectifier circuit 30 and the second bridge rectifier circuit 36 are used to perform full-wave rectification on an AC voltage to generate a detection signal (Earth_L signal or Earth_N signal).

However, half-wave rectification may also be used instead of full-wave rectification. Since it is also possible to detect whether a voltage is generated by half-wave rectification, half-wave rectification may also be used instead of full-wave rectification.

2. Half-Wave Rectification Circuit

Figure 5:
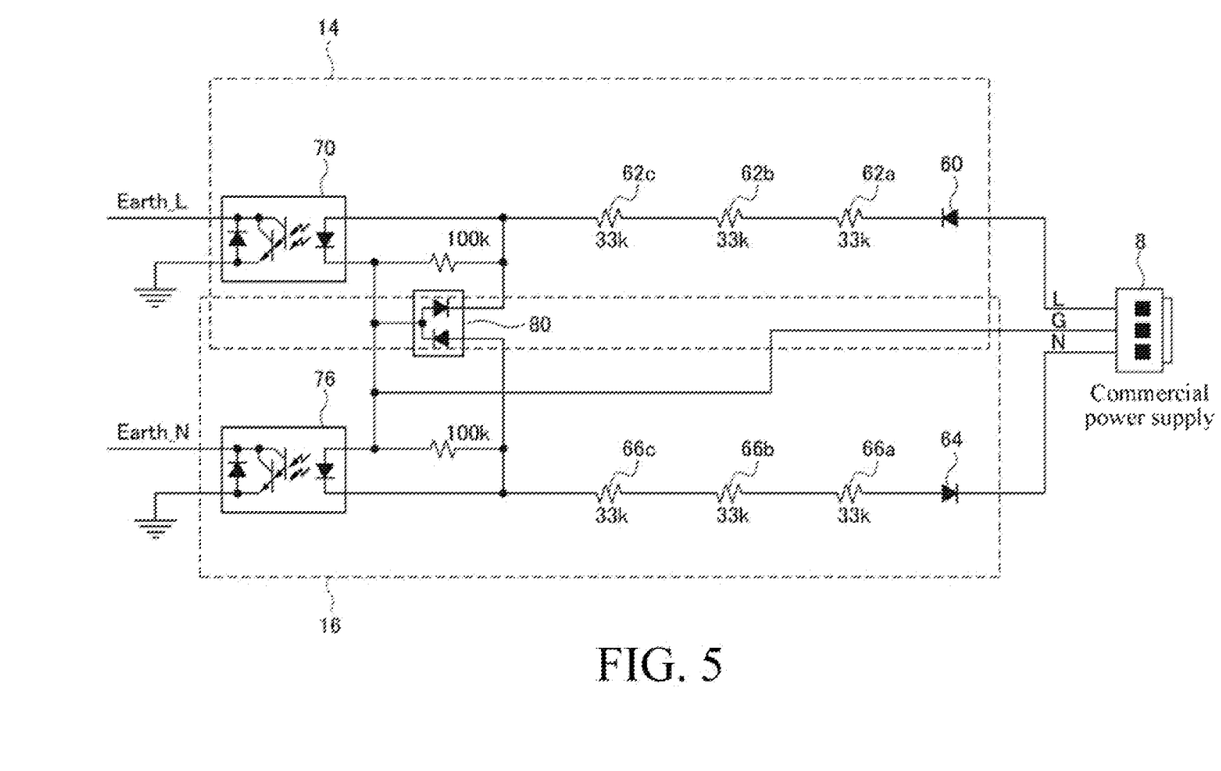
FIG. 5 is a circuit diagram of a first detection unit 14 and a second detection unit 16 when half-wave rectification is used instead of full-wave rectification.

FIG. 5 is a circuit diagram of a first detection unit 14 and a second detection unit 16 when half-wave rectification is used.

In FIG. 5, the first bridge rectifier circuit 30 in FIG. 2A is replaced with a first diode 60, and the second bridge rectifier circuit 36 is replaced with a second diode 64, and full-wave rectification is replaced with half-wave rectification. The other configuration is basically the same, a third optical coupler 70 in FIG. 5 is the same as the first optical coupler 40 in FIG. 2A, and a fourth optical coupler 76 is the same as the first optical coupler 46 in FIG. 2A. In FIG. 5, the Earth_L signal and the Earth_N signal may also be pulled up by the same resistor as the resistor 42 and a resistor 48 (not shown).

In FIG. 5, three series resistors 62a, 62b, 62c have the same function as the resistors 32a, 32b, 32c in FIG. 2A. The resistance value thereof is 33k, and the reason why the resistance value thereof is different from that of FIG. 2A is because FIG. 5 is a circuit diagram suitable for AC 200V. The resistors 66a, 66b, 66c in FIG. 5 are also the same.

Moreover, a diode 80 in FIG. 5 is a diode for protecting input ends of the third optical coupler 70 and the fourth optical coupler 76, and is not directly related to circuit functions.

3. Waveform

In this case, if half-wave rectification is used, a full-wave rectification waveform in FIG. 4 may be replaced with a half-wave rectification waveform. That is, a signal period of Earth_L in FIG. 4 is expanded to two times of an original signal period. In addition, in this case, by means of the periodic waveforms in FIG. 3A and FIG. 3B, the period may also be expanded to two times of an original period.

Therefore, when the earth line is not connected to the earth, a determination period of the earth state determining unit 18 is also expanded to two times of an original period. At this time, it is only necessary to determine whether each detection signal (Earth_L signal or Earth_N signal) is a periodic signal. However, when an acquisition period is much shorter than the determination period, it may be considered as a periodic signal as long as a signal that becomes "L" can be detected, and when the earth line is connected to the earth, it is not necessary to change the processing mode of the earth state determining unit 18 (CPU) regardless of full-wave rectification or half-wave rectification.

4. Effect

The half-wave rectification is basically the same as the full-wave rectification, it may be determined whether the G terminal is connected to the earth, and when the G terminal is connected to the earth, it may also be determined whether the power supply is connected in a normal phase or a reversed phase. In addition, compared with the full-wave rectification, the number of diodes required for the half-wave rectification is small, and device configuration can be miniaturized.

C. EMBODIMENT 3

1. Other Half-Wave Rectification

In Embodiment 2, the first detection unit 14 and the second detection unit 16 using half-wave rectification have been described. Since these circuits are half-wave rectified by diodes, during one period of AC supplied by the commercial power supply 8, the first half period is turned on (or turned off), and the second half period is turned off (or turned on). Since the first detection unit 14 and the second detection unit 16 are simultaneously turned on, when a leakage current flows into the earth, the currents of the two circuits flow simultaneously.

Therefore, if half-wave rectification in which the first detection unit 14 and the second detection unit 16 are alternately turned on can be performed, a peak value of the leakage current will be halved. According to this idea, a configuration example in which the first detection unit 14 and the second detection unit 16 are alternately turned on will be described in Embodiment 3.

2. Half-Wave Rectification Circuit

Figure 6:
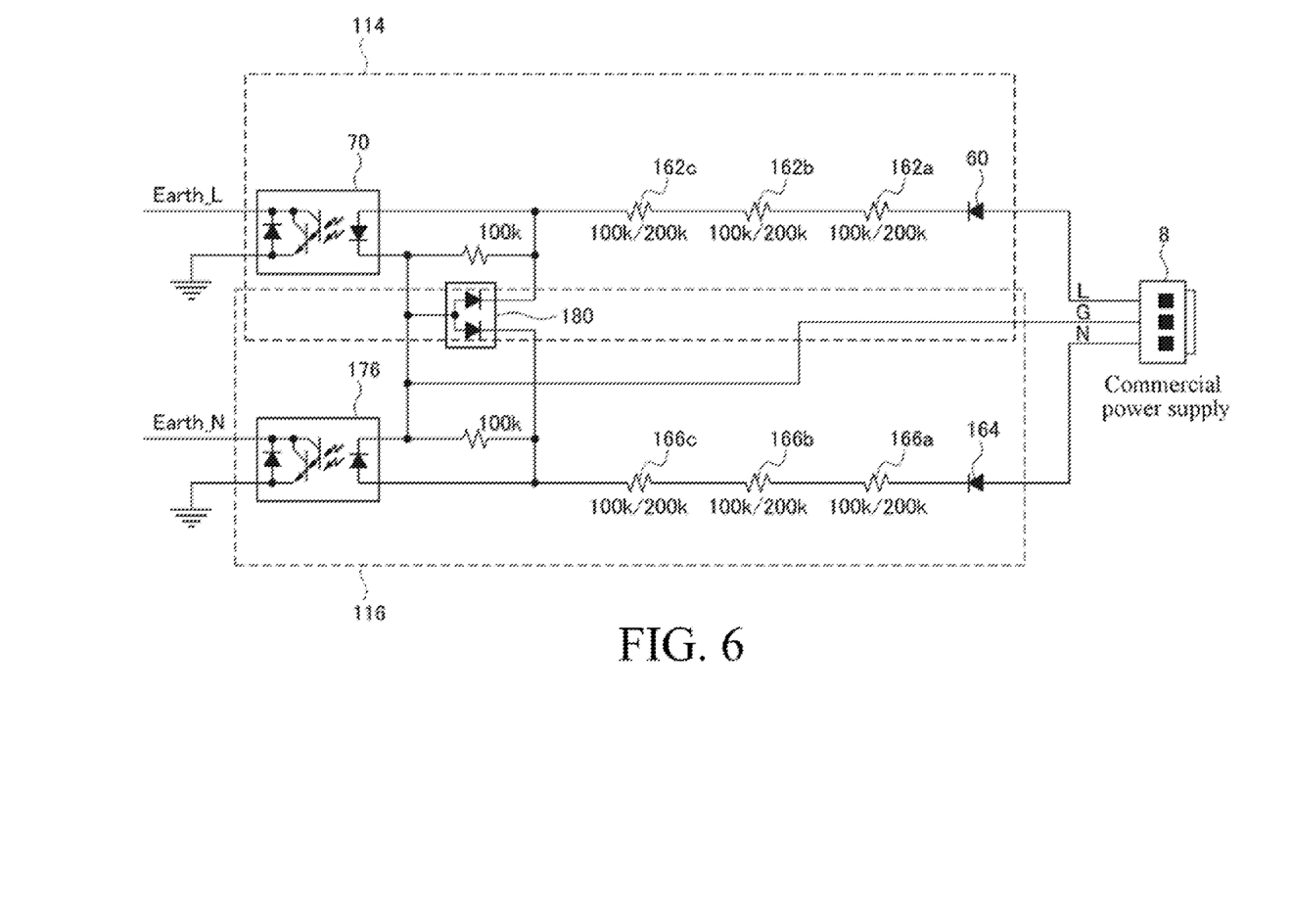
FIG. 6 is a circuit diagram of a first detection unit 114 and a second detection unit 116 during half-wave rectification involved in Embodiment 3.

The circuit diagrams of a first detection unit 114 and a second detection unit 116 involved in Embodiment 3 are as shown in FIG. 6. FIG. 6 is substantially the same as the circuit diagram of FIG. 5, and the same portions as those of FIG. 5 use the same symbols, but the following portions are different.

A second diode 164 of the second detection unit 116 is opposite in direction to the second diode 64 in Embodiment 2 (FIG. 5). With this configuration, the on time of the second detection unit 116 and the on time of the second detection unit 16 in Embodiment 2 (FIG. 5) differ by half a period. Therefore, the first detection unit 114 and the second detection unit 116 in Embodiment 3 are alternately turned on unlike Embodiment 2 (FIG. 5). Therefore, the magnitude of the leakage current in the present embodiment is about ½ of that of Embodiment 2.

Moreover, the direction of the second diode 164 of the second detection unit 116 is opposite to the direction of the second diode 64 in FIG. 5, and thus the direction of one of diodes 180 capable of protection is also different from the direction of the diode 80 in FIG. 5. This is because the voltage application direction is opposite to that of FIG. 5. Moreover, the diodes of opposite directions are diodes for protecting a second optical coupler 176 in the second detection unit 116 (referring to FIG. 6).

In addition, the second optical coupler 176 in FIG. 6 is the same component as the second optical coupler 76 in FIG. 5 except that connection terminals are opposite. That is, since the supply voltage is opposite, the terminals connected to the commercial power supply 8 are also opposite. It should be noted in FIG. 6 that the direction of the diode on an input side of the second optical coupler 176 is opposite to that of FIG. 5.

In addition, the resistors 162a, 162b, 162c in the first detection unit 114 in Embodiment 3 are set to 100 kΩ or 200 kΩ. This is because Japanese commercial power supplies generally use 100V or 200V. When the commercial power supply 8 is 100V, the resistors 162a, 162b, 162c may be set to 100 kΩ. When the commercial power supply 8 is 200V, the resistors 162a, 162b, 162c may be set to 200 kΩ. Therefore, the first optical coupler 70 may obtain a reasonable current by setting the resistance value.

Based on the same subject matter, the resistors 166*a*, 166*b*, 166*c* in the second detection unit 116 may be set to 100 kΩ or 200 kΩ (FIG. 6). When the commercial power supply 8 is 100V, the resistors 166*a*, 166*b*, 166*c* may be set to 100 kΩ. When the commercial power supply 8 is 200V, the resistors 166*a*, 166*b*, 166*c* may be set to 200 kΩ.

3. Waveform and Processing Mechanism 3.1 Earthing

When the circuit in FIG. 6 of Embodiment 3 is used, as in Embodiment 2, it may be considered that the full-wave rectification waveform in FIG. 4 is replaced with a half-wave rectification waveform. In addition, it may be considered that the periodic waveforms in FIG. 3A and FIG. 3B are also the same as in Embodiment 2, and the period is extended to two times of an original period.

Therefore, the determination method of the earth state determining unit 18 is basically the same as that of Embodiment 2. For example, in the case of normal earthing, whether the power supply line is connected in a normal phase or a reversed phase can be detected by the same processing mechanism as described above.

3.2 Not Earthing

However, in the case of not earthing, since the direction of an input diode of the second optical coupler 176 in FIG. 6 is opposite to the direction of an input diode of the second optical coupler 76 in FIG. 5, it is different from Embodiments 1 and 2 (FIG. 2B), the current does not flow from the L terminal to the N terminal.

Figure 3D:
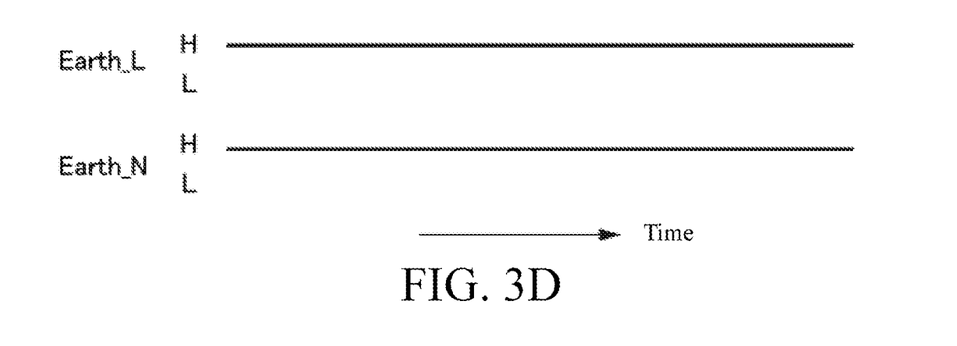
FIG. 3D is a waveform diagram of an Earth_L signal and an Earth_N signal when an earth G terminal is not connected to the earth according to Embodiment 3 of the present invention.

Therefore, the waveforms of the Earth_L signal and the Earth_N signal become the waveforms in FIG. 3D in the case of not earthing. In other words, both signals will be maintained in an "H" (High) state.

In addition, since both the Earth_L signal and the Earth_N signal of the earth state determining unit 18 are not periodically changing signals in this case, (first notification signal, second notification signal) is generated as (0, 0), and output to the PC24. Therefore, in Embodiment 3, the PC24 may determine the case of not earthing according to the first notification signal=0 and the second notification signal=0.

Corresponding Method for Compatible Software (1) As described above, when the G terminal is not connected to an earth line, that is, when the G terminal is not connected to the earth, the levels of the detection signals, that is, the Earth_L signal and the Earth_N signal, are different between Embodiment 1 (2) and Embodiment 3. Therefore, it is necessary to use other processing mechanisms in the software to enable the earth state determining unit 18 to detect the earth state.

However, software applicable to Embodiment 1 (2) and Embodiment 3 is achievable.

(2) First, when the Earth_L signal and the Earth_N signal are in different states, it is determined that the earth line is connected to the earth. This also includes the case of reversed-phase connection (reversed).

(3) Then, when the Earth_L signal and the Earth_N signal are in the same state, it is determined that the earth line is not connected to the earth.

By these determinations, software that is simultaneously applicable to Embodiment 1 (2) and Embodiment 3 may be implemented.

(4) Moreover, the software of the PC24 has been clearly stated in the previous explanation:

When (first notification signal, second notification signal)=(1, 0), the earth terminal is normally earthed (normal-phase connection).

When (first notification signal, second notification signal)=(0, 1), the power supply is reversed (reversed-phase connection) (the G terminal is normally earthed).

When (first notification signal, second notification signal)=(1, 1), the G terminal is not earthed.

When (first notification signal, second notification signal)=(0, 0), the G terminal is not earthed.

It is only required that the software is built according to the above determinations.

4. Effect

As described above, Embodiment 3 (FIG. 6) may reduce the leakage current flowing into the G terminal by half as compared with Embodiment 2.

C. DEFORMATION EXAMPLE

1. About Electrical Apparatus

In Embodiments 1, 2 and 3, the electrical apparatus is described by taking the laser processing device 10 as an example. In fact, any electrical apparatus using a commercial power supply is applicable.

2. Detection Signal

In Embodiments 1, 2 and 3, the first detection signal and the second detection signal are used. However, any signal may be used as the first detection signal as long as it is capable of detecting whether or not there is a detection signal of AC between the L terminal (terminal connecting a power supply line) and the earth terminal. In addition, any signal may be used as the second detection signal as long as it is capable of detecting whether or not there is a detection signal of AC between the N terminal (terminal connecting a neutral line) and the G terminal.

Moreover, in the above embodiment, when the first detection signal is a periodic signal, it may be determined that the L terminal has AC. Similarly, when the second detection signal is a periodic signal, it may be determined that the N terminal has AC. Other types of signals may also be used.

Full-wave rectification or half-wave rectification is used in Embodiments 1, 2 and 3, and a method of directly detecting AC may also be adopted. In addition, in Embodiments 1 and 2, an optical coupler is used to convert an analog signal into a digital signal. If a CPU (or microcomputer) can process the analog signal directly, the analog signal may also be processed directly without being converted to the digital signal. In addition, the analog signal may also be converted into the digital signal by using other methods in addition to the optical coupler. For example, an A/D converter or the like may be used, and the A/D converter may be used when the CPU constituting the earth state determining unit 18 includes the A/D converter. In addition, an insulating transformer (or pulse transformer) may also be used to replace the optical coupler.

E. CONCLUSION

The embodiments of the present invention have been described in detail above. However, the above embodiments are merely specific examples when the present invention is implemented. The technical scope of the present invention is not limited to the above embodiments. Various changes can be made without departing from the spirit and scope of the present invention, and modifications thereof are also included in the technical scope of the present invention.

What is claimed is:

1. An electrical apparatus using AC power generated between a power supply line L of a commercial power supply and a neutral line N of a commercial power supply, comprising:
   a first detection unit for detecting whether there is power between the power supply line L of the commercial power supply and an earth line G of the commercial power supply, and outputting a first detection signal;
   a second detection unit for detecting whether there is power between the neutral line N of the commercial power supply and the earth line G of the commercial power supply, and outputting a second detection signal; and
   an earth state determining unit for determining an earth state according to the first detection signal and the second detection signal,
   the earth state determining unit determining that:
   when the first detection signal indicates that there is power between the power supply line L and the earth line G and the second detection signal indicates that there is no power between the neutral line N and the earth line G, the commercial power supply is connected to the electrical apparatus in a normal phase, and the earth line G is earthed;
   when the first detection signal indicates that there is no power between the power supply line L and the earth line G and the second detection signal indicates that there is power between the neutral line N and the earth line G, the commercial power supply is connected to the electrical apparatus in a reversed phase, and the earth line G is earthed; and
   when the first detection signal indicates that there is power between the power supply line L and the earth line G and the second detection signal indicates that there is power between the neutral line N and the earth line G, the earth line G is not earthed.

2. The electrical apparatus according to claim 1, wherein when the first detection signal indicates that there is no power between the power supply line L and the earth line G and the second detection signal indicates that there is no power between the neutral line N and the earth line G, the earth state determining unit determines, in place of the determination in claim 1, that the earth line G is not earthed.

3. The electrical apparatus according to claim 1, wherein
   the first detection unit comprises a first rectifier circuit provided between the power supply line L and the earth line G, and a first signal output circuit for detecting whether the first rectifier circuit has a rectified voltage and outputting the first detection signal; and
   the second detection unit comprises a second rectifier circuit provided between the neutral line N and the earth line G, and a second signal output circuit for detecting whether the second rectifier circuit has a rectified voltage and outputting the second detection signal.

4. The electrical apparatus according to claim 3, wherein the first rectifier circuit is a first full-wave rectifier circuit for full-wave rectification, and the first signal output circuit comprises a first optical coupler for receiving a first output signal of the first full-wave rectifier circuit and outputting the first detection signal, the first detection signal being a signal obtained by isolating the first output signal; and
   the second rectifier circuit is a second full-wave rectifier circuit for full-wave rectification, and the second signal output circuit comprises a second optical coupler for receiving a second output signal of the second full-wave rectifier circuit and outputting the second detection signal, the second detection signal being a signal obtained by isolating the second output signal.

5. The electrical apparatus according to claim 3, wherein the first rectifier circuit is a first half-wave rectifier circuit for half-wave rectification, and the first signal output circuit comprises a first optical coupler for receiving a first output signal of the first half-wave rectifier circuit and outputting the first detection signal, the first detection signal being a signal obtained by isolating the first output signal; and
   the second rectifier circuit is a second half-wave rectifier circuit for half-wave rectification, and the second signal output circuit comprises a second optical coupler for receiving a second output signal of the second half-wave rectifier circuit and outputting the second detection signal, the second detection signal being a signal obtained by isolating the second output signal.

6. The electrical apparatus according to claim 4, wherein the earth state determining unit interrupts an output of the electrical apparatus according to a determination result of the earth state determining unit.

7. The electrical apparatus according to claim 4, comprising: an alarm unit for giving an alarm to a user of the electrical apparatus according to a determination result of the earth state determining unit.

8. The electrical apparatus according to claim 4, comprising: a display unit for displaying, according to a determination result of the earth state determining unit, the determination result to a user of the electrical apparatus.

9. An electrical apparatus, using AC between a power supply line L of a commercial power supply and a neutral line N of a commercial power supply, the electrical apparatus comprising:
   a first detection unit for detecting whether there is power between power supply line L of the commercial power supply and an earth line G of the commercial power supply, and outputting a first detection signal,
   a second detection unit for detecting whether there is power between the neutral line N of the commercial power supply and the earth line G of the commercial supply, and outputting a second detection signal; and
   an earth state determining unit for outputting the first detection signal and the second detection signal to the outside,
   wherein the earth state determining unit generates, when the first detection signal is a periodic signal, a first notification signal having a value of "1", generates, when the first detection signal is a non-periodic signal, a first notification signal having a value of "0", generates, when the second detection signal is a periodic signal, a second notification signal having a value of "1", generates, when the second detection signal is a non-periodic signal, a second notification signal having a value of "0", and outputs the first notification signal and the second notification signal to the outside.

10. An earth state determining method for determining an earth state of an electrical apparatus, the electrical apparatus using AC generated between a power supply line L of a commercial power supply and a neutral line N of a commercial power supply, comprising:

a first detection unit for detecting whether there is power between the power supply line L of the commercial power supply and an earth line G of the commercial power supply, and outputting a first detection signal;

a second detection unit for detecting whether there is power between the neutral line N of the commercial power supply and the earth line G of the commercial power supply, and outputting a second detection signal; and an earth state determining unit for determining an earth state according to the first detection signal and the second detection signal, the earth state determining method comprising:

a first detection step of detecting, by the first detection unit, whether there is power between the power supply line L of the commercial power supply and the earth line G of the commercial power supply and outputting a first detection signal;

a second detection step of detecting, by the second detection unit, whether there is power between the neutral line N of the commercial power supply and the earth line G of the commercial power supply and outputting a second detection signal; and an earth state determining step of determining, by the earth state determining unit, an earth state according to the first detection signal and the second detection signal, the earth state determining step comprising:

step 1: when the first detection signal indicates that there is power between the power supply line L and the earth line G and the second detection signal indicates that there is no power between the neutral line N and the earth line G, determining that the commercial power supply is connected to the electrical apparatus in a normal phase, and the earth line G is earthed;

step 2: when the first detection signal indicates that there is no power between the power supply line L and the earth line G and the second detection signal indicates that there is power between the neutral line N and the earth line G, determining that the commercial power supply is connected to the electrical apparatus in a reversed phase, and the earth line G is earthed; and step 3: when the first detection signal indicates that there is power between the power supply line L and the earth line G and the second detection signal indicates that there is power between the neutral line N and the earth line G, determining that the earth line G is not earthed, the earth state determining method for determining an earth state of an electrical apparatus comprising any of the above steps.

11. The electrical apparatus according to claim 5, wherein the earth state determining unit interrupts an output of the electrical apparatus according to a determination result of the earth state determining unit.

12. The electrical apparatus according to claim 5, comprising: an alarm unit for giving an alarm to a user of the electrical apparatus according to a determination result of the earth state determining unit.

13. The electrical apparatus according to claim 5, comprising: a display unit for displaying, according to a determination result of the earth state determining unit, the determination result to a user of the electrical apparatus.

* * * * *